United States Patent [19]

Eckberg et al.

[11] Patent Number: 5,650,453
[45] Date of Patent: Jul. 22, 1997

[54] UV CURABLE EPOXYSILICONE BLEND COMPOSITIONS

[75] Inventors: Richard P. Eckberg, Saratoga Springs; Michael J. O'Brien, Clifton Park, both of N.Y.

[73] Assignee: General Electric Company, Waterford, N.Y.

[21] Appl. No.: 431,697

[22] Filed: Apr. 28, 1995

[51] Int. Cl.⁶ .................................................. C08F 2/46
[52] U.S. Cl. .............................. 522/31; 522/99; 522/148; 522/149; 522/170; 522/172
[58] Field of Search ...................... 522/31, 99, 148, 522/149, 170, 172

[56] References Cited

U.S. PATENT DOCUMENTS

| | | | |
|---|---|---|---|
| 4,279,717 | 7/1981 | Eckberg et al. | 204/159.13 |
| 4,617,238 | 10/1986 | Crivello et al. | 428/452 |
| 4,981,881 | 1/1991 | Crivello et al. | 522/31 |
| 4,987,158 | 1/1991 | Eckberg | 522/31 |
| 5,034,491 | 7/1991 | Wewers et al. | 528/41 |
| 5,138,012 | 8/1992 | Riding et al. | 525/478 |
| 5,178,959 | 1/1993 | Eckberg et al. | 428/447 |
| 5,227,410 | 7/1993 | Eckberg et al. | 522/75 |
| 5,240,971 | 8/1993 | Eckberg et al. | 522/31 |
| 5,258,480 | 11/1993 | Eckberg et al. | 528/15 |
| 5,360,833 | 11/1994 | Eckberg et al. | 522/31 |
| 5,364,888 | 11/1994 | Aoki et al. | 522/170 |
| 5,369,205 | 11/1994 | Eckberg et al. | 528/25 |
| 5,411,996 | 5/1995 | Eckberg et al. | 522/170 |

FOREIGN PATENT DOCUMENTS

| | | |
|---|---|---|
| 0108208 | 5/1984 | European Pat. Off. . |
| 0625533 | 11/1994 | European Pat. Off. . |
| WO9322369 | 11/1993 | WIPO . |
| WO9407965 | 4/1994 | WIPO . |

*Primary Examiner*—Mark Chapman
*Attorney, Agent, or Firm*—Kenneth S. Wheelock

[57] ABSTRACT

Blends of epoxysilicone polymers and vinyl ether monomers or oligomers and an effective amount of a suitable iodonium photocatalyst provide an ultraviolet curable low viscosity silicone coating composition.

17 Claims, No Drawings

UV CURABLE EPOXYSILICONE BLEND COMPOSITIONS

FIELD OF THE INVENTION

This invention relates to improved ultraviolet light curable silicone release coating compositions. More particularly, it relates to blends of epoxy functional polydiorganosiloxane silicone polymer fluids with vinyl ether monomers and oligomers.

BACKGROUND OF THE INVENTION

Silicone coating compositions are useful for many applications including release (adhesive) coatings, protective coatings, and conformal coatings. These coatings are usually applied to substrates as dispersions in a solvent system in order to reduce the viscosity sufficiently so that the coating composition is easily coatable. The presence of the solvent, either water or some suitable low boiling organic solvent, necessitates evaporation. Thus, the application of heat to articles coated with silicones has served two purposes, removal of solvent and thermally induced curing. The elimination of solvent is desirable for two significant reasons some organic solvents constitute an environmental and/or a safety hazard and elimination of evaporation reduces the energy requirements for preparation of the coated article. Elimination of the need for a heat curing step allows consideration of alternative curing mechanisms such as a radiation cure employing either actinic or electron beam radiation.

The absence of solvent from a coating composition lowers the necessary energy required for cure eliminating the need for costly pollution abatement equipment. This absence of solvent has a drawback insofar as some silicone coating compositions are thick, viscous mixtures that are difficult to coat without the viscosity reduction provided by the dilution of a solvent. Thus thin, defect-free, and uniform coatings are difficult to achieve with such materials. Certain photo-catalysts, particularly onium type photo-catalysts, may require the presence of a compatibilizing solvent to render them soluble in the silicone coating mixture.

Radiation curable protective coatings are useful for a variety of applications, such as topcoats over printed matter and similar uses. Such radiation curable compositions are typically highly functional reactive substances which cure to yield highly cross-linked, glossy, and hard coatings. Silicone coatings of this type frequently contain so-called Q functional siloxane groups ($SiO_{4/2}$) in their structure. Such Q containing silicones are generally referred to as resins to distinguish them from silicone fluids which are usually linear, consisting of largely of repeating D groups ($R_2SiO_{2/2}$, where R usually is methyl). Highly reactive organofunctional silicone Q resins are typically very viscous semi-solids or friable solids at room temperature and thus not readily coatable because they are not liquid. Indeed, when functionalized with polar organic moieties that are radiation cross-linkable, even linear silicone fluids can become highly viscous and therefore difficult to coat using standard coating techniques.

Because of their low durometer and extensible nature when cured, silicone conformal coatings are useful for the protection of electrical components and circuitry. Fluorosilicones are particularly well-suited to use as conformal coatings because of their resistance to solvent swelling and degradation. Photo-curable silicones that are intended for low modulus cured coatings typically consist of linear silicone molecules that have photo-reactive centers widely separated by non-functional polysiloxane segments so that a low cross-link density results when the silicone is cured. Because they consist almost entirely of polydimethylsiloxane segments, such photo-curable silicone polymers are incompatible with 'onium ionic photo-catalysts. This incompatibility results in an inefficient and/or slow photo-cure. The fluorosilicone polymers suffer from these same drawbacks.

Silicone compositions have long been used for rendering surfaces non-adherent to materials which would normally adhere thereto. Epoxy-functional silicones such as taught in U.S. Pat. No. 4,279,717, when combined with certain compatible iodonium cationic photo-catalysts, are known to be useful for release coating purposes. Epoxy-silicone release coatings allow high speed processing with minimal energy expenditures. If the viscosity of the coating composition exceeds 1,000 centistokes (cstk) at room temperature, the absence of solvent in the composition renders them difficult to apply, particularly if a thin coating on the order of 1 $gm/m^2$ is desired. The viscosity constraint imposed by processing equipment thus imposes constraints on the molecular weight of the silicone composition and on linearly functionalized photo-curable silicone fluids such as epoxy-silicones. Additional constraints are provided by the need for photo-catalyst miscibility or solubility, the need for a rapid photo-cure response, and good release performance. While a high epoxy content in an epoxy-silicone, as epoxy functional groups on a linear silicone molecule, tend to promote 'onium photo-catalyst compatibility with the silicone and a rapid photo-cure, a low epoxy content is required for premium or low force release characteristics.

Controlled release is an additional aspect of photo-curable epoxy-silicone release performance. Compositions containing both epoxy functional and phenol functional silicones as taught in U.S. Pat. No. 5,138,012, and Q resins containing epoxy-silicones as taught in U.S. Pat. Nos. 5,360,833 and 5,369,205 provide a so-called controlled release. Controlled release refers to a controllable and predictable release force that may be varied from very easy to very tight depending on the desired application.

SUMMARY OF THE INVENTION

The present invention is based on the discovery that certain photo-curable additives are miscible with photo-curable silicone compositions. Thus these additives simultaneously reduce the viscosity of certain photo-curable silicones and improve the performance of these same silicones with respect to protective, conformal, and solvent resistant applications. The present invention provides for photo-curable silicone release coating compositions that photo-cure efficiently, possess an easy application to substrates without loss of rapid photo-cure wherein such a photo-cured silicone provides a controlled release adhesive surface, or a protective coating or a solvent resistant coating. The compositions of the present invention also provide for a curable additive for photo-curable silicone compositions selected from the group consisting of vinyl ether monomers and oligomers that meets these goals.

The present invention thus provides for an ultra-violet or electron beam curable silicone coating composition comprising:

(a) an epoxy functional silicone selected from the group consisting of $MD_xD^E_yQ_zT_uD^{RF}_jD^A_kD^P_l(D'(CH(R)CH_2O)_m)_nD^B_gM$,
$M^ED_xD^E_yQ_zT_uD^{RF}_jD^A_kD^P_l(D'(CH(R)CH_2O)_m)_nD^B_gM^E$,
$M^ED_xD^E_yQ_zT_uD^{RF}_jD^A_kD^P_l(D'(CH(R)CH_2O)_m)_n D^B_pM$, and mixtures thereof;

where
M=(CH$_3$)$_3$SiO$_{1/2}$,
M$^E$=(C$_6$H$_9$O(CH$_2$)$_2$)(CH$_3$)$_2$SiO$_{1/2}$,
D=(CH$_3$)$_2$SiO$_{2/2}$,
D'=(CH$_3$)$_3$SiO$_{2/2}$,
D$^E$=(C$_6$H$_9$O(CH$_2$)$_2$)(CH$_3$)SiO$_{2/2}$,
D$^R$=(CF$_3$CH$_2$CH$_2$)(CH$_3$)SiO$_{2/2}$,
D$^A$=((HO)(C$_2$H$_3$)C$_6$H$_9$(CH$_2$)$_2$)(CH$_3$)SiO$_{2/2}$,
D$^F$=((HO)(C$_6$H$_4$)(CH$_2$)$_3$)(CH$_3$)SiO$_{2/2}$,
D$^B$=((C$_6$H$_5$COO)(HO)(C$_6$H$_9$)(CH$_2$)$_2$)(CH$_3$)SiO$_{2/2}$,
Q=SiO$_{4/2}$,
T=(CH$_3$)$_3$SiO$_{3/2}$, where R is selected from the group consisting of hydrogen, methyl, and ethyl, and where j, k, l, m, n, p, x, y, z, and u are positive integers and k, l, n, p, u and z may be zero and wherein said epoxy functional silicone has a viscosity ranging from about 100 to about 100,000 centistokes at 25° C.;

(b) an unsaturated ether compound selected from the group consisting of:
CH$_2$=CH—O—(CH$_2$)$_{11}$CH$_3$,
(CH$_2$=CH—O—CH$_2$)$_2$—(C$_6$H$_{10}$)
CH$_2$=CH—O—(CH$_2$CH$_2$—O—)$_3$—CH=CH$_2$,
(CH$_2$=CHOCH$_2$)(HOCH$_2$)(C$_6$H$_{10}$),
CH$_2$(CH$_2$CO$_2$CH$_2$—C$_6$H$_{10}$—CH$_2$OCH=CH$_2$)$_2$
(CH$_2$=CHO(CH$_2$)$_4$O$_2$C)$_2$(C$_6$H$_4$),
and mixtures thereof; and (c) an effective amount of a bis(dodecylphenyl) iodonium salt photocatalyst, said photocatalyst being selected from the salts of the group of acids consisting of hexafluoroantimonic acid, hexafluoroarsenic acid, hexafluorophosphoric acid, tetrafluoroboric acid, tetra (perfluorophenyl)boric acid and mixtures thereof. The subscripts on the various components of the epoxy-functional silicones may be varied at will within the constraints already listed, i.e. either non-zero or optionally zero such that the viscosity is within the defined range. The present invention further provides for curable silicone compositions comprising unsaturated ether compounds selected from the group consisting of:
CH$_2$=CH—O—(CH$_2$)$_{11}$CH$_3$,
(CH$_2$=CH—O—CH$_2$)$_2$—(C$_6$H$_{10}$)
CH$_2$=CH—O—(CH$_2$CH$_2$—O—)$_3$—CH=CH$_2$,
(CH$_2$=CHOCH$_2$)(HOCH$_2$)(C$_6$H$_{10}$),
CH$_2$(CH$_2$CO$_2$CH$_2$—C$_6$H$_{10}$—CH$_2$OCH=CH$_2$)$_2$
(CH$_2$=CHO(CH$_2$)$_4$O$_2$C)$_2$(C$_6$H$_4$),
and mixtures thereof.

DETAILED DESCRIPTION OF THE INVENTION

The epoxy functional polydiorganosiloxane fluids provided by the instant invention are more specifically dialkylepoxysiloxy- or trialkylsiloxy chain-stopped polydialkyl-alkylepoxysiloxane copolymers that are diluted with a reactive vinyl ether monomer or oligomer. The reactive vinyl ether or monomer is independently cross-linkable by virtue of the presence of the vinyl ether groups present in the monomer. Thus curing of the combination system provided by the present invention results in two interpenetrating polymerized polymer networks that may or may not be cross-linked to each other at certain points.

The epoxy functionality is obtained when certain of the hydrogen atoms on the polysiloxane chain of the polydialkyl-alkyl hydrogen-siloxane copolymer are reacted with organic molecules that contain both an ethylenic unsaturation and epoxide functionality; via a hydrosilation addition reaction as taught in U.S. Pat. No. 5,258,480.

The ultraviolet light and/or electron beam curable epoxy-functional silicone fluid can therefor comprise an epoxy-functional dialkylalkylsiloxy- or trialkylsiloxy- chain stopped polydialkyl alkylepoxy siloxane copolymer fluid that is the product of sequential hydrosilation reactions involving a polydialkyl-alkyl hydrogen siloxane with a separate polydialkylsiloxane that includes ethylenically unsaturated groups, followed by reaction with an ethylenically unsaturated epoxide monomer wherein the resulting epoxy-silicone fluid is diluted with a vinyl ether monomer or oligomer.

The alkyl groups of the pre-cross linked polydialkyl-alkylepoxide siloxane are preferably methyl groups. The ethylenically unsaturated group containing polydialkylsiloxane is preferably a vinyl containing polydialkylsiloxane, most preferably a vinyldimethyl-siloxy- chain stopped polydimethylsiloxane. The ethylenically unsaturated epoxy or epoxide monomer is preferably an unsaturated cyclo-aliphatic epoxy compound such as 4-vinylcyclohexene oxide (VCHO), vinylnorbornenemonoxide, limonenemonoxide, or dicyclo-pentadienemonoxide.

The hydrosilation reactions used for pre-crosslinking and subsequent functionalization of silylhydride containing polysiloxanes are preferably catalyzed by trace amounts of Group VIII noble metal compounds. By Group VIII noble metals, applicants define the group to consist of the elements ruthenium, rhodium, palladium, osmium, iridium, and platinum.

The vinyl functional silicone employed in the pre-crosslinking network synthesis may be selected from the group consisting of dimethylvinylsiloxy chain stopped polydimethylsiloxane, dimethylvinyl-siloxy chain stopped polydimethyl-methylvinyl siloxane, tetravinyl tetramethylcyclotetrasiloxane, and sym-tetramethyl divinyl-disiloxane.

The hydrogen functional siloxane precursor fluid can be selected from the group consisting of tetrahydrotetramethylcyclotetrasiloxane, dimethylhydrogensiloxy chain stopped polydimethyl-methylhydrogen siloxane, trimethylsiloxy chain stopped polydimethyl-methylhydrogen siloxane, and sym-tetramethyldisiloxane.

Vinyl ether monomers and oligomers have been recently commercialized in terms of being widely available in large quantities. As a cationically polymerizable monomer or oligomer, vinyl ether monomers and oligomers have been discovered to be useful additives and diluents in cationic photo-curable systems containing epoxy functionalities. Further, the usefulness of these compounds has been extended to include hybrid cure systems, i.e. systems that simultaneously utilize both free-radical initiators and cationic onium salts for curing polymerization. These compositions are not only photo-curable, they are also curable by means of electron beam curing techniques. The reactive diluents, exemplified by vinyl ether monomers and oligomers, utilized by the present invention include a group consisting of:

CH$_2$=CH—O—(CH$_2$)$_{11}$CH$_3$,
(CH$_2$=CH—O—CH$_2$)$_2$—(C$_6$H$_{10}$)
CH$_2$=CH—O—(CH$_2$CH$_2$—O—)$_3$—CH=CH$_2$,
(CH$_2$=CHOCH$_2$)(HOCH$_2$)(C$_6$H$_{10}$),
CH$_2$(CH$_2$CO$_2$CH$_2$—C$_6$H$_{10}$—CH$_2$OCH=CH$_2$)$_2$
(CH$_2$=CHO(CH$_2$)$_4$O$_2$C)$_2$(C$_6$H$_4$),

The chemical formulas of the compounds in the foregoing list are written without regard for the positional isomerism of the substituents. Specific structural isomers of these general formulas are commercially available and these specific examples are used in the experimental section demonstrating reduction to practice and utility. Since the polymerizing and crosslinking functions of these molecules should depend only on the vinyl substituent(s), the relative positional isomerism of the vinyl substituents should not affect the chemical properties for which these compounds are employed in this invention. Therefore these compounds are claimed as the general structures with the expectation that geometric isomers having the same empirical and molecular formula will function sufficiently similarly to effect the purposes of this invention.

We have discovered that when the vinyl ether diluted epoxy functional silicone polymers described previously are combined with a miscible bis-aryl iodonium catalyst, the resulting mixture can be exposed to ultraviolet light or an electron beam to initiate a curing reaction that forms a solid silicone release coating which incorporates the photopolymerized vinyl ether or vinyl ether oligomer.

Ultraviolet light curable or electron beam curable epoxy-functional silicone compositions of the instant invention may be applied to cellulosic or plastic film substrates including but not limited to supercalendered kraft (SCK) paper, glassine paper, polyethylene kraft (PEK) paper, polyethylene film, polypropylene film, and polyester film. A reaction, initiated by ultraviolet light, cures the liquid silicone release coating to form a solid non-adherent, i.e. adhesive, release surface on the substrate so coated.

Acrylate functional silicones, such as those taught in U.S. Pat. No. 5,034,491 are also photo-curable in the presence of photo-initiators. Photocurable acrylate silicone compositions that are photocurable in the presence of the more common free-radical photo-initiators typically require stabilizers, e.g. hydroquinone. Typical common photo initiators such as benzophenone and its derivatives are generally completely insoluble in silicone media, as are most stabilizers. Low solubility leads to problems as to an appropriate choice of these necessary additives. Another problem associated with free-radical photocure silicone systems is the cure inhibition brought about by the presence of oxygen, which requires that the coated substrate be under an inert atmosphere such as nitrogen while undergoing ultraviolet radiation for a prompt cure response. While maintaining an inert atmosphere in an ultraviolet or electron beam cure chamber is feasible, the requirement for an inert atmosphere adds complications and expense to a coating and curing process.

It has previously been discovered that ultraviolet and/or electron beam curable epoxy-silicone polymers such as those taught by Eckberg et al. in U.S. Pat. No. 4,279,717 are efficiently cured in the presence of certain compatible onium-type cationic photocure catalysts without being subject to the drawback of being inhibited in the presence of oxygen. These epoxy-silicone compositions are constrained within a narrow range of viscosity and epoxy content that is dictated by the need for a defect free coating that is about 0.1 to 0.3 mil thick coating of the polymers that can be applied to the substrate at high application speeds and by the necessity for these photocurable compositions to quickly photocure upon exposure to ultraviolet light while maintaining good adhesion to the substrate.

Three roll offset gravure or multi-roll film splitting application techniques commonly practiced for the high speed coating of solvent free silicones requires that the silicones be in the range of 100 to 3,000 centistokes viscosity at the temperature where applied, rapid cure requires sufficient amount of reactive oxirane be present in the epoxy-silicone molecule to facilitate onium-type catalyst dissolution and to ensure a high reactivity of the system. If too much oxirane is reacted into the silicone fluid composition a photo cured epoxy-silicone composition with the desired release performance will not result.

The epoxy functional silicones comprising the coating composition of the instant invention are selected from the group consisting of $MD_xD^E_yQ_zT_uD^{Rf}_jD^A_kD^P_i(D'(CH(R)CH_2O)_m)_nD^B_pM$, $M^ED_xD^E_yQ_zT_uD^{Rf}_jD^A_kD^P_i(D'(CH(R)CH_2O)_m)_nD^B_pM^E$, $M^ED_xD^E_yQ_zT_uD^{Rf}_jD^A_kD^P_i(D'(CH(R)CH_2O)_m)_nD^B_pM$, and mixtures thereof;

where $M=(CH_3)_3SiO_{1/2}$, $M^E=(^C_6H_9O(CH_2)_2)(CH_3)_2SiO_{1/2}$, $D=(CH_3)_2SiO_{2/2}$, $D'=(CH_3)_3SiO_{2/2}$, $D^E=(C_6H_9O\ (CH_2)_2)(CH_3)SiO_{2/2}$, $D^{Rf}=(CF_3CH_2CH_2)(CH_3)SiO_{2/2}$, $D^A=((HO)(C_2H_3)C_6H_9(CH_2)_2)(CH_3)SiO_{2/2}$, $D^P=((HO)(C_6H_4)(CH_2)_3)(CH_3)SiO_{2/2}$, $D^B=((C_6H_5COO)(HO)(C_6H_9)(CH_2)_2)(CH_3)SiO_{2/2}$, $Q=SiO_{4/2}$, $T=(CH_3)_3SiO_{3/2}$, where R is selected from the group consisting of hydrogen, methyl, and ethyl, and where j, k, l, m, n, p, x, y, z, and u are positive integers and k, l, n, p, u and z may be zero and wherein said epoxy functional silicone has a viscosity ranging from about 100 to about 100,000 centistokes at 25° C. The subscripts on the various components of the epoxy functional silicones may be varied at will within the constraints already listed, i.e. either non-zero or optionally zero such that the viscosity is within the defined range. This viscosity can exceed the ability of most coating technology to utilize the high viscosity epoxy functionalized silicone in an undiluted form. Most diluents will have a tendency to lower the cross-link density and cure speed of the cured silicone. Therefore selecting a diluent that lowers the viscosity of the silicone coating composition while essentially maintaining the cross-link density and speed of photo-cure of the cured silicone composition becomes essential to being able to utilize the higher viscosity epoxy functionalized silicones. An additional consideration regarding the choice of diluent is that the curing catalyst must remain miscible with the silicone diluent mixture. Typical diluents slow the cure rate by one of two phenomena, either a dilution effect or an intrinsically slower cure rate; the combination of both effects is undesirable. Certain vinyl ethers and vinyl ether oligomers possess a desirable combination of properties, they lower the viscosity and accelerate the cure of the coating composition. In addition, the inclusion of a second reactive component frequently provides the additional benefit of decreasing the time required to achieve a cured state, i.e. the curing rate is increased. Thus the vinyl ether diluents of the instant invention provide a novel silicone coating composition that enables the use of higher viscosity epoxy functionalized silicones by reducing the viscosity of the coating mixture and simultaneously improves the cure rate of the mixture so that faster and more efficient coating may be achieved. The system thus is a dual cure system. Since the composition is a solventless or essentially 100% solids composition as defined in the art, the fraction of vinyl ether or vinyl ether oligomers present in the silicone coating mixture ranges from about 1 to about 49 weight percent, more preferably from about 2 to about 25 weight percent, and most preferably from about 5 to about 20 weight percent. Based on a coating composition of 100 parts containing about 10 to 20 weight percent reactive diluent and 90 to 80 weight percent epoxy functionalized high viscosity silicone 0.5 to 3 parts of cationic-type cure catalyst are added, more preferably 0.5 to 2 parts and most preferably 1 to 1.5 parts.

The requirement for a prompt efficient photocure militates that photo initiators and photosensitizers be freely miscible with the photo-crosslinkable compositions in which they are mixed, preferably forming clear solutions, but at least forming stable suspensions or dispersions. In the case of the epoxy-functional photocurable silicones of the instant invention, onium-type cationic photo catalysts must be compatible with the epoxy-silicone fluid. Iodonium salts of the general formula [(R-Ph)2I]+X— have been designed to address the miscibility issue where R is typically a mixture of various alkyl fragments derived from linear alkylate grade dodecylbenzene and generically called dodecyl although the mixture is not pure dodecyl. As a consequence of the impurity of the dodecylbenzene, the compounds exhibit a freezing point depression relative to the pure compound and thus tend to exist in a non-crystalline, amorphous, semi-fluid state that is compatible with the epoxy-silicones of the instant invention. These dodecylbenzene iodonium cationic photocure catalysts are thus well-suited for use as photo catalysts for the ultraviolet cured epoxy-silicone release systems. The hexafluoroantimonate salts are most preferred for the compositions of the instant invention because they tend to combine high activity with excellent miscibility.

The UV curable epoxy functional silicone compositions of the present invention can be applied to cellulosic and other substrates including paper, metal, foil, glass, PEK paper, SCK paper, and polyethylene, polypropylene and polyester films. A UV initiated reaction will cure the epoxy functional silicone compositions of the present invention and form a non-adherent, adhesive surface on the coated substrate.

DESCRIPTION OF THE PREFERRED EMBODIMENTS

Ultraviolet light curable silicone coating compositions of the present invention are obtained by combining an iodonium salt which is effective for catalyzing an ultraviolet light initiated cure reaction of the silicone coating composition, with a dialkylepoxysiloxy- or trialkylsiloxy-chain-stopped epoxy siloxane fluid having a viscosity of approximately 100 to 100,000 centistokes at 25° C.

The preferred UV-light initiator or photocatalyst utilized by the present invention is a diaryl iodonium salt derived from "linear alkylate" dodecylbenzene. Such salts have the following general formula:

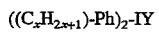

wherein x is an integer varying from about 6 to about 18, Y equals $SbF_6$, $AsF_6$, $PF_6$, or $BF_4$ and Ph stands for a phenyl group. These bis(4-dodecylphenyl) iodonium salts are very effective initiators for the UV cure of a wide range of epoxy functional silicones.

"Linear alkylate" dodecylbenzene is known commercially and is prepared by Friedel-Craft alkylation of benzene with a $C_6$–$C_{14}$ α-olefin cut. Consequently, the alkylate contains a preponderance of branched chain dodecylbenzene, but there may, in fact, be large amounts of other isomers of dodecylbenzene such as ethyldecylbenzene, plus isomer of undecylbenzene, tridecylbenzene and etc. Note, however, that such a mixture is responsible for the dispersive character of the linear alkylate derived catalyst and is an aid in keeping the material fluid. These catalysts are flee-flowing viscous fluids at room temperature.

The bis-dodecylphenyl iodonium salts (II) are profoundly different from previously characterized diaryliodonium salts (I). They are both pentane-soluble and water-insoluble. The improvements in solubility and catalytic efficiency of these branched chain substituted salts are further underscored by comparison with analogous salts prepared from straight chain n-tridecylbenzene and n-dodecylbenzene. Two examples of these salts include bis(4-n-tridecylphenyl) iodonium hexafluoroantimonate which have a long linear hydrocarbon chains. These salts (I), in contrast to the new salts (II), are waxy solids which are neither pentane nor water-soluble, and which disperse very poorly in the epoxy functional silicones utilized by the coating compositions of the present invention. These catalysts afford very sluggish UV cures when utilized for release coatings.

The UV curable silicone coating compositions of the present invention utilize epoxy functional silicone fluids which can be prepared in several ways. Epoxy compounds containing both unsaturation and oxirane such as 4-vinylcyclohexeneoxide, react with silylhydride functional polysiloxanes via a hydrosilation reaction. An analogous hydrosilation reaction between vinyl siloxane groups and silylhydride functional polysiloxanes is a well-known means of crosslinking or curing silicone polymers. This reaction may be used to partially cross link silylhydride functional silicones and vinyl functional silicones creating thereby a lightly cross linked network structure. The presence of an initial excess of silylhydride groups relative to the vinyl siloxane reactant creates a polymer with residual silyl hydride groups that may undergo subsequent addition with unsaturated epoxy compounds to produce epoxy functional silicones.

The epoxy functional silicones can be prepared from other vinyl-or allylic-functional epoxy compounds containing olefinic moieties such as allylglycidylether or glycidyl acrylate, vinylnorbornene monoxide and dicyclopentadiene monoxide. Although cyclohexyl epoxy compounds are particularly useful, other vinyl-functional cycloaliphatic epoxy compounds may also be used without significantly altering the properties of the product. The scope of the invention is not limited to the epoxide species used in the examples.

The epoxy functional polysiloxane intermediate fluids can be prepared in any of several ways. The following examples illustrate several of these methods but it must be understood that the present inventions are not limited by these examples. Those skilled in the art will be able to provide other epoxy functional silicone intermediate fluids upon consideration of these examples. All U.S. patents referenced in this application are hereby and herewith incorporated by reference.

EXAMPLES

Preparation of Epoxy Functional Resin

Preparation of Polymer A 100 g of a 25 centistoke viscosity epoxysilicone resin of approximate stoichiometry $M^H_2Q$ where $M^H=H(SiCH_3)_2O-$ and $Q=SiO_{4/2}$, with 0.9 weight percent reactive H, were blended with 200 g toluene and 0.4 g $RhCl(Ph_3P)_3$ catalyst. After heating to 105° C., 115 g of 4-vinylcyclohexene oxide (VCHO) were added dropwise, followed by holding the mixture at a temperature of 110° C. for a period of four hours. Fourier Transform Infrared Spectroscopy (FTIR) showed that all of the SiH had reacted. 0.2 g $CH_3N(C_{18}H_{37})_2$ stabilizer was added , and the toluene and other light ends remaining in the reaction mixture were removed by vacuum distillation at 125° C. yielding 202 g of a 11,000 centistoke viscosity fluid product, having a refractive index of 1.4806. Based on the starting material, the product stoichiometry was $M^E{}_2Q$.

The resin prepared above was mixed with a photocatalyst, (4-octyloxyphenyl) phenyl-iodonium hexafluoroantimonate at a level of 1 weight percent of the photocatalyst. 2 mil coatings of this $M^E{}_2Q$ resin cured upon exposure to 16 mJ/cm² focused ultraviolet light from a medium pressure mercury vapor source, forming a hard glossy protective coating.

Several blends of the above prepared resin were prepared by mixing the above prepared resin with the following compounds:

I.

$CH_2=CH-O-(CH_2CH_2-O-)_3-CH=CH_2$.

II.

$(CH_2OCH)-(CH_2)_9CH_3$.

III.

$(CH_2=CH-O-CH_2-(C_6H_8)-CH_2-O-)_2(C(O)CH_2CH_2C(O))$, and

IV.

$(OC_6H_8)_2(CH_2CO_2)$.

TABLE I

Blend Viscosities with Compounds I and II

| $M^E{}_2Q$ Resin wt. % | I. wt. % | II. wt. % | Viscosity cps at 25° C. |
|---|---|---|---|
| 100 | 0 | 0 | 11,000 |
| 90 | 10 | 0 | 1,288 |
| 85 | 15 | 0 | 578 |
| 80 | 20 | 0 | 295 |
| 50 | 50 | 0 | 26 |
| 90 | 0 | 10 | 1298 |
| 85 | 0 | 15 | 561 |
| 80 | 0 | 20 | 288 |
| 75 | 0 | 25 | 165 |
| 50 | 0 | 50 | 24 |

One to one, i.e. 50 weight percent mixtures of the above prepared resin and compounds III and IV were also prepared. The viscosity of the 50:50 blend of the resin and III was 337 cstk while the viscosity of the 50:50 blend of the resin and IV was 1078. In this case the divinyl ether is a superior viscosity reducing agent. Both blends were clear fluids. From the data in Table I and the data regarding the 50:50 blends, compounds I and II are very effective viscosity modifiers for epoxysilicone resins.

A photocatalyst, (4-octyloxyphenyl) phenyl-iodonium hexafluoroantimonate, was added at the 1 weight percent level to selected blends and the undiluted resin and subsequently evaluated for the amount of ultraviolet flux necessary to cure 2 mil coatings on polyethylene kraft substrates to a smear-free and migration-free firmly-anchored coating, which was a glossy, hard surface useful as a protective coating based on its appearance and properties.

Based on the dilution and cure studies, the divinyl ether I and III are equally effective as the epoxy compounds II and IV for purposes of viscosity reduction in cationically catalyzed photo-cure epoxy silicone compositions and the divinyl ethers promote a faster photo-cure response.

TABLE 2

UV Dose Requirements for Diluted Epoxysilicone Resins

| Epoxy Silicone wt. % | I wt. % | II wt. % | III wt. % | IV wt. % | UV Dose mJ/cm² |
|---|---|---|---|---|---|
| 50 | 50 | 0 | 0 | 0 | 12 |
| 50 | 0 | 50 | 0 | 0 | 24 |
| 50 | 0 | 0 | 50 | 0 | 22 |
| 50 | 0 | 0 | 0 | 50 | 68 |
| 80 | 20 | 0 | 0 | 0 | 10 |
| 80 | 0 | 20 | 0 | 0 | 22 |
| 100 | 0 | 0 | 0 | 0 | 16 |
| 0 | 0 | 0 | 100 | 0 | 31 |
| 0 | 0 | 0 | 0 | 100 | 66 |

Preparation of Polymer B 370 g of a hydride functional silicone polymer of approximate structure $M^H D_{100} D_{20} M^H$, where $D=(CH_3)_2SiO$— and $M^H$ is as described in the preparation of polymer A, were mixed with 370 g of toluene and 0.17 g $RhCl(Ph_3P)_3$ catalyst. This mix was brought to 77° C. and 128 grams VCHO(1.03 moles) were added over a 35 minute period, followed by 1 hour hold at 115° C., which resulted in complete reaction of SiH. 0.05 grams stabilizer (same as above) were added, the batch stripped of solvent to afford 478 grams yield of 2486 cstk viscosity fluid product, $n^D{}_{25}=1.4368$, approximate structure $M^E D_{100} D^E{}_{20} M^E$, where $D^E=$ $$(OC_6H_9)CH_2CH_2-\underset{\underset{CH_3}{|}}{Si}-O_{2/2}$$

This resin is much lower in reactive organofunctional epoxide content than the first resin prepared, $M^E{}_2Q$, and as a consequence it is considerably less polar and less miscible with the polar vinyl ether monomer and oligomer diluents of the instant invention than the Q containing resin. These results are confirmed in blending and cure tests. Similar to the cured coatings obtained from polymer A, the cured coatings obtained from polymer B are hard, glossy, highly cross-linked materials suitable for protective coatings.

TABLE 3

Linear Epoxy Silicone Blend Results

| $M^E D_{100} D^E{}_{20} M^E$ wt. % | I wt. % | II wt. % | III wt. % | IV wt. % | Viscosity cstk | UV Dose mJ/cm² |
|---|---|---|---|---|---|---|
| 100 | 0 | 0 | 0 | 0 | 2500 | 23 |
| 80 | 20 | 0 | 0 | 0 | 582 | 23 |
| 80 | 0 | 20¹ | 0 | 0 | nm | 29 |
| 80 | 0 | 0 | 20² | 0 | nm | nm |
| 80 | 0 | 0 | 0 | 20² | nm | nm |

Notes:
All preparations were evaluated with 1 wt. % photocatalyst, (4-octyloxyphenyl) phenyl-iodonium hexafluoroantimonate.
nm not measurable
1. hazy, mixture separated slowly
2. opaque, mixture separated quickly These data demonstrate that diluent miscibility is an important property of the system being used for UV cure.

POLYMER C

A devolatilized, 300 cstk viscosity epoxysilicone fluid of approximate structure $M^E D_{60} D^E{}_4 M^E$ was prepared as taught by Eckberg and Agars, U.S. Pat. No. 5,258,480.

POLYMER D

An epoxy-functional dimethylsilicone-polyether block copolymer was prepared in a two step sequential hydrosilation copolymer process as taught by Eckberg, U.S. Pat. No. 4,987,158, and Eckberg et al, U.S. Pat. No. 5,227,410 and U.S. Pat. No. 5,240,971. 95 grams of an SiH-functional silicone of approximate structure $MD_{15}D^H{}_4{}^M$ were dispersed in 100 grams of a 3:1 toluene:MEK solvent mix with 10 grams of a dimethylvinylsiloxy-stopped linear dimethylsiloxane $M^{Vi}D_{100}M^{Vi}$ plus 10 grams of a diallyl-stopped polyethyleneoxide, $CH_2=CHCH_2O(CH_2CH_2O)_{10}$—$CH_2CH=CH_2$ and a catalytic amount of platinum hydrosilation catalyst. This mix was agitated at 80° C. for 2 hours to form a lightly crosslinked silicone-polyether network prior to addition of 18 grams VCHO, which consumed remaining SiH. Removal of solvents and other light ends in vacuo provided 105 grams yield of a 230 cstk silicone fluid product incorporating both reactive cycloaliphatic-epoxy and linear polyethyleneoxide blocks.

POLYMER E

An epoxy-functional fluorosilicone resin of structure $M^E{}_4D^{Rf}{}_4Q$ was prepared as taught by Eckberg and Evans, U.S. Pat. No. 5,178,959. $D^{Rf}=CF_3CH_2CH_2Si(CH_3)O$— with $M^E$ and Q as described previously.

POLYMER F

An epoxy-functional dimethylsiloxane was prepared as taught by Eckberg, U.S. Pat. No. 4,987,158. 100 grams of an SiH-functional silicone of structure $MD^H{}_3D_{20}M$ were reacted with 16 grams of a vinyl-stopped silicone $M^{Vi}D_{100}M^{Vi}$ by 2 hours' reaction at 90° C. in the presence of a catalytic amount of $RhCl_3(Bu2S)_3$ catalyst, followed by sequential reaction of remaining SiH with VCHO to produce a 350 cstk lightly crosslinked epoxysilicone fluid when devolatilized in vacuo.

POLYMER G

An 800 cstk viscosity epoxysilicone incorporating hydroxy-benzoate groups of approximate structure $MD_{20}D^E{}_2D^B{}_2M$, where $D^B=((C_6H_5COO)(HO)(C_6H_9)(CH_2)_2)(CH_3)SiO_{2/2}$ and M, D, and $D^E$ are as described above was prepared as taught in U.S. Pat. No. 4,977,158.

POLYMER H

A 467 cstk viscosity partially-acrylated devolatilized silicone polymer was prepared as described by Eckberg in Docket 60SI-1605. The product so obtained had the approximate structure $M^ED_{60}D^A{}_2D^E{}_2M^E$, where $D^A=$

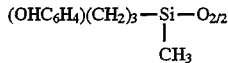

It should be noted that this polymer includes both reactive epoxy and acrylate functionality.

POLYMER I

A 1336 cstk viscosity epoxy-functional polydimethyldiphenylsiloxane terpolymer of approximate molecular structure $M^ED_{90}D^E{}_5D^{Ph2}{}_5M^E$, with refractive index= 1.4423, where $D^{Ph2}=$—$Si(C_6H_5)_2O$—, and the other siloxy groups as described previously.

POLYMER J

An epoxy-functional dimethylsilicone polymer was prepared as described as Polymer F above. 100 grams of this polymer, containing 0.1 mole oxirane, were reacted with 3.6 gram acrylic acid (0.05 mole) as described in docket 60SI-1605. The resultant product was a 900 cstk viscosity partially acrylated epoxysilicone similar to Polymer H, but also incorporating long chains of polydimethylsiloxane in the polymer structure.

POLYMER K

A 280 cstk viscosity linear epoxy-dimethylsiloxy chain stopped polydimethylsiloxane-polyethyleneoxide block copolymer of structure MED54D'(EO)10D'D54ME, where $D'=$—$Si(CH_3)_2CH_2CH_2CH_2$—, $EO=$—$OCH_2CH_2$—, and D and $M^E$ are as described above, was prepared via sequential hydrosilation of an $M^HD_{54}M^M$ silicone polymer with diallyl-stopped polyethyleneoxide than VCHO, as taught by Eckberg et al in U.S. Pat. Nos. 5,227,410 and 5,240,971.

POLYMER L

A linear, 1200 cstk viscosity, epoxydimethylsiloxy-stopped polydimethylsiloxane-polyethyleneoxide block copolymer of structure $M^ED_{88}D'(EO)_{10}D'D_{88}M^E$ was prepared the same way as Polymer K.

POLYMER M

A linear, 500 cstk viscosity trimethylsiloxy-chain stopped linear polymer bearing both epoxy and phenol functionality was prepared via sequential hydrosilation of an $MD^H{}_4D_{20}M$ polymer with 2-allylphenol and VCHO to provide a product of structure $MD^E{}_2D^P{}_2D_{20}M$, where $D^P=$

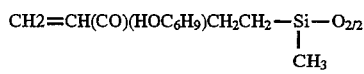

as taught by Riding et al, U.S. Pat. Nos. 5,139,012 and 4,952,657.

Polymer P

An epoxy silicone resin of approximate composition $M^E{}_3M_{12}T_{10}Q_{10}$ was prepared as described in U.S. Pat. No. 5,860,833. This resin is useful component of ultra-violet curable controlled release coatings when combined with linear epoxy stopped dimethylsiloxanes such as $M^ED_{25}M^E$. The resin is a tacky solid at room temperature which flows at temperatures above 100° C. but which cannot be used in concentrations greater than 60% when combined with the epoxy-stopped silicone polymer without the viscosity of the resulting silicone blend exceeding 1,000 centistokes at room temperature. Since a tight controlled release of the photocured coating can be obtained with higher levels of the resin or Q functional component in the coating, larger release differentials should be obtainable if a coating composition could be formulated that incorporated a higher concentration of polymer P.

Composition Q 160 grams of neat epoxysilicone resin polymer, polymer P, as previously described was heated to 120° C. and subsequently treated with 40 g of the divinyl ether monomer CVHE, stirred briefly, then cooled. A clear fluid was obtained that had a viscosity of 210 centistokes. This polymer possessed approximately 80 weight percent polymer P yet it was still coatable at room temperature.

100 parts by weight of composition Q were mixed with 2 parts by weight of catalyst 2 to produce a clear, curable bath. This bath was then coated on a PEK liner by itself and in blends with a 100/2 mix of polymer C to catalyst 2 using a laboratory solventless coating device. All coatings were cured by exposure to approximately 50 mJ/cm² focused ultraviolet light. Release of the cured coatings was assessed versus TESA 4970 acrylic test tape, obtaining the following results:

| Bath | Release, g/in at 50 ipm pull |
| --- | --- |
| 100% Q/C | >1,000 g |
| 80/20 Q/c | 750 g |
| 60/40 Q/C | 400 g |
| 40/60 Q/C | 195 g |
| 25/75 Q/C | 105 g |
| 100% Polymer C | 28 g |

By way of contrast, a coated and ultraviolet cured bath consisting of 60% polymer P and 40% epoxy stopped D25 silicone fluid gave 295 g/in release at 50 inches per minute pull. This is one third the tight release obtained with CRA composition Q. The effectiveness of polymer P epoxysilicone resin as a controlled release composition is increased when it is combined with CHVE divinylether diluent which permits it to make up higher concentrations in the ultraviolet cure baths.

The epoxy-functional silicone polymers described in examples A through M were tested for photocure response, either neat or in blends with vinyl ether monomers or other additives, using cationic type iodonium photocatalysts to promote cure on UV light irradiation. Two iodonium catalyst packages were utilized in this series of studies:

Catalyst 1: 50% solution of (4-octyloxyphenyl) phenyliodoniumhexafluoroantimonate in bis (1,3-diglycidoxypropyl)tetramethyldisiloxane. This catalyst is taught by Crivello et al, U.S. Pat. No. 4,981,881.

Catalyst 2: Solution of about 50% bis(dodecylphenyl) iodoniumhexafluoroantimonate+2% isopropylthioxanthone sensitizer in a mixture of $C_{12}$ and $C_{14}$ alkylglycidylether diluent.

Cure studies were carried out using an RPC Model QC1202AN Lab UV Processor fitted with 2 Hanovia medium pressure mercury vapor ultraviolet sources capable of independent operation at 100, 200, or 300 watts/inch nominal lamp power mounted above a conveyer capable of 10 to 500 ft/min. line speed. Cure was determined qualitatively by the absence of smear-, migration-, and ruboff of the coating from the substrate. Polyethylenekraft paper (PEK) was the substrate used for most determinations. Total lamp power and conveyer line speed were manipulated until the combination of minimum lamp power and maximum conveyer line speed required for good qualitative cure was determined. UV flux at these fixed Processor conditions was measured with a photometer, enabling report of UV Flux needed for crosslinking.

The nonpolar nature of polydimethylsiloxanes renders unmodified epoxysilicones such as Polymer B immiscible with common polyfunctional vinyl ether and epoxy monomer diluents unless the silicone moiety is very rich in epoxy functionality. We therefore investigated the utility of vinyl ether diluents i modified epoxysilicones which incorporate other functional groups besides reactive epoxy groups to render the silicone polymer more polar. Accordingly, Polymer D, an epoxy-silicone-polyether block copolymer, was found to be miscible with triethyleneglycoldivinylether (TEGDVE), also known as DVE-3. The following coating baths were prepared:

1) 100 part Polymer D+1 part catalyst 1
2) 90 parts Polymer D+10 parts DVE-3 +1 part catalyst 1

Each bath was clear mixture, indication good solubility of the components in both cases.

0.5 mil coatings of the two baths were manually applied to PEK, then cured to a smear-and migration-free adhesive surface in the RPC device. Coating bath 1 required 120 mJ/cm$^2$ total UV flux for good cure, while bath 2, which included about 10% DEV-3 divinyl ether monomer, cured well on exposure to 62 mJ/cm$^2$. In other words, addition of 10 parts of vinyl ether to 90 parts of the photocatalysed epoxysilicone-polyether copolymer doubled the cure rate. The same baths were applied to PEK liner on an 18 inch offset gravure pilot coating line equipped with 2 banks of Fusion Systems™ microwave-fired 'H' lamps. With both lamp banks set at 450 watt/inch power, coating bath 1, applied to PEK liner at 1.4 g/m$^2$ coat weight, was well-cured at 400 feet/min line speed; bath 2, coated and exposed to the same UV light sources, was nicely cured at 750 ft/minute line speed. As in the lab experiment, the vinyl ether diluent present at 10% concentration enabled a doubling of cure speed when run on the pilot scale coater.

The effect of DVE-3 on release performance of Polymer D was ascertained by laminating coated specimens of bath 1 and bath 2 cured at 200 ft/min. with Monsanto Gelva™ 263 solvent-borne PSA with a paper stock applied atop the adhesive layer. 2 inch wide tapes were cut, then the force required to peel away the silicone-coated PEK from the adhesive-coated paper strip at 400 inch/minute strip speed was determined. The cured epoxysilicone-polyether copolymer released the acrylic PSA at a force of 80 g/2 inch; the DVE-3 containing coating of bath 2 released the same PSA at 390 g/2 in, suggesting that polyvinyl ether diluents can also find use as tight or controlled release additives along with being cure promoters in epoxysilicones with which they are miscible.

Another class of the epoxysilicone polymer which proved to be miscible with DVE-3 was epoxyfluorosilicones, in particular Polymer E. Coating baths 3 and 4 were prepared as follows: BATH 3 =100 parts polymer E+1 part of catalyst solution 1, while Bath 4 +50 parts Polymer E+50 parts DVE-3+1 part catalyst 1. Baths 3 & 4 were clear solutions. Lab draw-downs of 2 mil thick coatings of baths 3 and 4 were prepared on PEK, and it was found that bath 3 cured well on exposure to 75 mJ/cm$^2$ UV flux while bath 4 required but 42 mJ/cm$^2$ UV flux for the same degree of cure. In this case, the 50/50 mix of epoxyfluorosilicone polymer E/DVE-3 divinyl ether monomer photocured almost twice as fast as the non-vinyl ether case. Besides promoting faster photocure response, the DVE-3 present in the cured epoxyfluorosilicone coating did not affect the excellent solvent resistance the fluorosilicone exhibited without the monomer additive.

The above-described polymer F, an unmodified epoxysilicone polymer, is immiscible with DVE-3 vinyl ether diluent. However, polymer F is soluble in a fluorinated alcohol, octafluoropentanol (OFP). We subsequently determined that an 80:10:10 blend of polymer F:DVE-3:OFP made a clear solution, coating bath 5, when 100 parts of the blend were mixed with 2 parts of catalyst solution 1. Polymer F was immiscible with catalyst solution 1 without the fluoroalcohol+divinyl ether present. Coating bath 5 was applied to a PEK liner on the 18 inch 3 roll offset gravure pilot coater described above, at 1.2 g/m$^2$ weight, and photocured with the 2 Fusion H lamps at 800 fpm line speed. The cured coating/liner lamina required 100 g/2 in force to peel it from the Gelva 263 acrylic PSA/paper lamina in the fashion described above, which is a useful release force for release liner applications. It should be noted that the catalyst solution 1 is not miscible with polymer F in the absence of the fluoroalcohol+vinyl ether diluent mixture.

Experiments carried out with the epoxy-stopped linear polydimethylsiloxane-polyether block copolymers K and L described above confirmed that addition of divinylether monomers to photocurable blends of polymers K and L resulted in improved physical properties in the resultant photocured films of K and L alone. Sufficient amounts of test baths were prepared to fill a 12×12 cm Teflon mold to a depth of about 40 mils. The molds were passed through the RPC UV Cure Processor at a slow speed sufficient to cure the baths to a depth of 30–35 mils. The partially-through cured slabs so obtained were extricated from the mold, and their wet backside cured by a second pass through the Processor. Tensile bars were cut, and a Monsanto T-10 Extensometer equipped with a 22 lb load cell was used to determine ultimate elongation and tensile at break. Our result are tabulated below:

| COATING TENSILE | HARDNESS, SHORE A | ELONGATION, % | ULTIMATE |
|---|---|---|---|
| Polymer K | 13 | 64 | 34 psi |
| 90:10 K:CHVE | 32 | 59 | 103 |
| 90:10 K:DVE-3 | 12 | 101 | 47 |
| 90:10 K:Vectomer**4020 | 14 | 170 | 73 |
| 90:10 K:Vectomer**4010 | 14 | 97 | 50 |
| Polymer L | <5 | 180 | 18 |
| 90:10 L:CHVE | 10 | 144 | 56 |

(All photocurable compositions included 2 parts of catalyst solution 1 to 100 parts of polymer blend).
**Vectomer is trademark of Allied-Signal Corporation
CHVE = 1,4 cyclohexanedimethanolmonovinylether, $(CH_2=CH-O-CH_2)_2-(C_6H_{10})$.
DVE-3 = $CH_2=CH-O-(CH_2CH_2-O-)_3-CH=CH_2$,
Vectomer 4010 = $CH_2(CH_2CO_2CH_2-C_6H_{10}-CH_2OCH=CH_2)_2$
Vectomer 4020 = $(CH_2=CHO(CH_2)_4O_2C)_2(C_6H_4)$,
1,4-butan-di-ol monovinylether benzoate.

In each case (polymers K and L), inclusion of 10% of the vinyl ether monomers tabulated above improved ultimate tensile properties of the photocured films, either accompanied by improved elongation or by small decreases thereof. The CHVE monomer was particularly useful for increasing strength and hardness of photocured films of these epoxysilicone-polyether block copolymers.

An epoxysilicone fluid modified by inclusion of hydroxybenzoate functionality, polymer G above, was found to be miscible with CHVE. We then ascertained the effect of CHVE additive on cure and release performance of polymer G by determining minimum lamp power and maximum conveyer line speed combination required for smear- and migration-free photocure of a 0.5 mil thick coating on PEK liner, as described above. These results were recorded:

| BATH | VISCOSITY | LAMP POWER | SPEED | UV DOSE |
|---|---|---|---|---|
| Polymer G | 800 cstk | 600 watt/in | 300 ft/min | 40 mJ/cm$^2$ |
| 9/1 G/CHVE | 380 | 400 | 400 | 17 |

(both baths include 2 parts catalyst 1 per 100 parts Bath)

As was observed in the case of Polymer D, 10% divinylether diluent lowers bath viscosity and also speeds photocure response.

An epoxysilicone fluid modified by conversion of a portion of the oxiranes to hydroxyacrylate groups via reaction with acrylic acid, polymer H above, was found to be miscible with the CHVE divinylether diluent. Photocure of this polymer (with or without CHVE) required use of a cationic iodonium salt catalyst plus a typical free-radical photoinitiator, since both epoxy and acrylate were present on the silicone polymer. Accordingly, photocurable baths prepared with this polymer included 2 parts catalyst solution 1 plus 4 parts of Darocur™ 1173 free radical UV initiator per 100 parts of polymerizable material. Cure experiments were conducted in a nitrogen atmosphere in the RPC 25 Processor, with these results:

| BATH | LAMP POWER* | SPEED* | UV DOSE |
|---|---|---|---|
| Polymer H | 400 watt/inch | 400 ft/min. | 18 mJ/cm$^2$ |
| 9:1 H:CHVE | 300 | 500 | 11 |

*Combination of minimum lamp power/maximum conveyer line speed for smear- and migration - free surface, 0.5 mil thick coating on PEK.

CHVE monomer obviously enhances photocure of a dual epoxy-acrylate functional silicone. The 2 baths described above were coated to a deposition of 1 g/m$^2$ coat weight on PEK sheets using a lab coater, then cured under nitrogen in the RPC Processor at 400 watt/inch lamp power and 100 fpm line speed. Silicone-coated sheets then had Tesa™ 4970 acrylic test tape affixed to them, and the resultant tape-silicone-liner laminates oven-aged at 70° C. for 20 hours before the force required to separate the tape from the cured silicone coating at a strip speed of 50 inch/minute was recorded, with this result:

| COATING | RELEASE, G/IN |
|---|---|
| Polymer H | 125 |
| 9:1 H:CHVE | 200 |

While the overall release of cured coatings or polymer H proved to be fairly high relative to that of conventional photocured epoxysilicones such as polymer C, the recorded value is in a useful range ... addition of 10% CHVE causes a 60% increase in recorded release, indicating potential utility of CHVE (or other divinylether analogs) for tight release (sometimes referred to a controlled release additive, CRA) purposes.

An epoxysilicone fluid modified by inclusion of diphenylsiloxane units, polymer I above, was also found to be freely miscible with CHVE monomer. The 1336 cstk viscosity of polymer 1 was reduced to 630 viscosity when 9 parts of 1 were mixed with 1 part CHVE. 100 parts of polymer 1 and of the 9:1 blend of 1:CHVE were mixed with 2 parts of iodonium catalyst solution 1, then tested for photocure response as 0.5 mil thick coatings on PEK substrate as described above, with these results:

| BATH | LAMP POWER* | SPEED* | UV DOSE |
|---|---|---|---|
| Polymer 1 mJ/cm$^2$ | 300 watt/inch | 400 ft/min. | 10 |
| 9:1 1:CHVE | 200 | 400 | 6.3 |

*Combination of minimum lamp power and maximum conveyer line speed required for smear- and migration- free 0.5 mil coating on PEK, in air.

Both baths showed exceptional photocure response, but even in this case, 10% CHVE monomer reduced the UV flux needed for cure by 40%. Next, 1 g/m$^2$ coat weight of each of these polymer 1 baths were applied to PEK liner using a lab coater and cured as described for polymer H above, then laminated with TESA 4970 tape. Release of the coated PEK from the tape was measured following 70° C. aging of this laminate for 20 hours, with these results:

| COATING | RELEASE, G/IN* |
|---|---|
| Polymer I | 75 |
| 9:1 1:CHVE | 150 |

*50 ipm pull speed

Inclusion of only 10% CHVE in the polymer I coating bath doubles the release against the acrylic test tape, which is excellent controlled release additive behavior. In addition, cured coatings of both polymer I and its blend with CHVE were found to be easily marked with ink, a useful property that is not observed with conventional silicone release agents.

Experiments described to this point have shown that vinyl ether monomers are useful additives in compatible photocurable epoxysilicone systems capable of modifying viscosity, speeding photocure response, strengthening photocured films derived therefrom, and altering the release characteristics of the photocured films. We have also demonstrated that vinyl ethers are beneficial additives for dual-curable photoactive silicones bearing both acrylate and epoxy groups. Polymer J (described above) is such a compound. Blending 1 part of dodecylvinyl ether, DDVE (a monovinyl ether) with 9 parts of J reduced the viscosity of the coating material from 900 cstk to 360 cstk, thereby rendering it much easier to apply as a thin, uniform coating. (DDVE proved completely miscible with polymer J). A series of photocure studies was carried out to determine the minimum UV light flux required for complete qualitative cure of polymer J and of 9:1 J:DDVE in the presence of free radical, cationic, and a combination of both kinds of photocatalysts. Results for 0.5 mil thick coatings applied to PEK liner stock were the following:

| POLYMER | PHOTOCATALYST | LAMP POWER | SPEED | ATMOSPHERE |
|---|---|---|---|---|
| J | Catalyst 1,2% | 300 watt/in | 400 ft/min | AIR |
| 9:1 J:DDVE | " | 300 | 400 | AIR |
| J | Darocur 1173,4% | 600 (incomplete cure*) | 300 | NITROGEN |
| 9:1 J:DDVE | " | | | NITROGEN |
| J | " | (No cure*) | | AIR |
| J | Catalyst 1 + D-1173 | 300 | 400 | AIR |
| 9:1 J:DDVE | " | 300 | 500 | AIR |

*At 600 watts/in UV lamp power and 50 fpm conveyer speed 'Darocur-1173' is Ciba-Geigy trademark for 2-hydroxy-2-methyl-1-phenylpropan-1-one.

This dual-functional polymer (epoxy and hydroxyacrylate) is not efficiently photocured solely by a free-radical type of photoinitiator (Darocur 1173) in this case), even under nitrogen atmosphere. However, rapid complete cure is obtained when the cationic PHOTOCATALYST 1 is present, both with and without the added radical catalyst. Even though DDVE is monofunctional and might therefore be expected to slow cure of the system, it inclusion in the coating bath at 10% load does not affect cure rate, which is surprising. A release study of polymer J using TESA 4970 acrylic test tape was carried out as described above, with variation in cure atmosphere and cure additives. 20 hour 70° C. aged release was recorded for 1 g/m² coatings on PEK which were completely cured by exposure to 600 watts/inch lamp power at 100 ft/min line speed in the RPC device. Our results are as follows:

| BATH | CATALYST | CURE ATMOSPHERE | RELEASE* |
|---|---|---|---|
| J | Cationic catl. 1 | AIR | 45–50 g/in |
| J | D-1173 radical catl. | Nitrogen | >500 g/in |
| J | Cationic + radical | Nitrogen | 55–60– g/in |
| 9:1 J:DDVE | " | Nitrogen | 70–75 g/in |

*50 inch/min pull speed

Incomplete cure caused by lack of cationic catalyst is manifested by the unacceptable release performance recorded for the second bath of this series. DDVE additive has little effect on release, unlike CHVE, and is therefore a useful viscosity modifier for epoxysilicone release agents or epoxy/acrylate dual functional silicones with which it is compatible.

A series of experiments was then carried out to determine the effect of vinyl ether monomers on cure and release performance of epoxysilicone release agents when crosslinked by electron beam (EB) radiation rather than UV light radiation, since it has been established that vinyl ethers polymerize when irradiated by EB in the presence of iodonium catalysts. EB trails were conducted using a 3 roll offset pilot coater to coat thin, uniform coatings of test baths on PEK liner; cure of these coatings was effected by exposure to low energy electron beam electron beam (beta rays) generated by an Energy Sciences Electrocurtain™ device. Total EB dose (expressed as MegaRads, MR) was controlled by variation in filament current and voltage while maintaining a constant web speed of 50 ft/min. The coat weight of the test baths was held at 0.8 g/m². The iodonium catalyst solution 2 described previously was utilized for this study. Coating baths consisting of Polymer C (defined above) plus catalyst 2 with and without vinyl ether monomers DDVE and CHMVE, where CHMVE 1,4-cyclohexanedimethanolmonovinyl ether, $CH_2=CH-O-CH_2-(C_6H_{10})-CH_2OH$, were prepared and used for the EB experiments. An additional variable was the oxygen content of the EB cure chamber, which was controlled by varying the pressure of nitrogen gas sweeping the chamber. Minimum EB dose, in MR, needed to cure test coatings to smear- and migration- free state was determined, with these results:

| BATH | OXYGEN CONC. | EB DOSE |
|---|---|---|
| 100/3 C/C/catalyst 2 | <20 ppm | 3 MR |
| " | 275 | 3 |
| 90/10/3 C/DDVE/catalyst 2 | <20 | 2 |
| " | 300 | 2 |
| 90/10/3 C/CHMVE/catalyst 2 | <20 | 2 |
| " | 300 | 2 |

Addition of 10 parts of compatible monovinyl ether diluent improves overall EB cure efficiency of this polymer C system by a factor of ⅓. Oxygen concentration did not affect cure of this cationic system; analogous free-radical curable silicones such as acrylated silicones, are not properly EB cured unless oxygen is rigorously excluded from the EB cure chamber (typically<50 ppm). Release was measured for 3 MR cured coatings of the 3 baths above using TESA 4154 SBR adhesive test tape in the same way described for earlier experiments. These release results were obtained:

| BATH | OXYGEN CONC. | RELEASE |
|---|---|---|
| 100/3 Polymer C/Catalyst 2 | 11 ppm | 125 g/in |
| " | 275 | 130 |
| 90/10/3 C/DDVE/Catl. 2 | 11 | 170 |
| " | 300 | 75 |
| 90/10/3 C/CHMVE/Catl. 2 | 18 | 270 |
| " | 300 | 80 |

The release results are interesting and unexpected. DDVE and CHMVE (at 10 wt%) act to raise the release when cure is effected in an inert environment, but have the opposite effect when cure of this cationic system occurs with higher oxygen level is present. Subsequent adhesion, determined by measuring the force needed to peel the TESA 4154 tape from a clean steel panel before and after having been in contact with the cured silicone coatings, was >100% in all cases, indicating that differences in measured release were not the result of incomplete cure. It should be noted that EB cure of acrylated silicones requiring oxygen concentrations <50 ppm are difficult to achieve at high line speeds; cationic-catalyzed vinyl ether+epoxysilicone release agents cure to satisfactory release coating under EB in the presence of oxygen, which is an advantage for the user since it eliminates the need for stringent inerting, a difficult and complex engineering problem when coating is carried out at high line speed.

We have also demonstrated that CHVE divinyl ether monomer unexpectedly serves to improve the controlled release efficiency of polymer M (described previously), which was developed to function as a tight release additive for cationic photocurable epoxysilicone release agents such as polymers C and F. 3 parts of polymer M were mixed with 1 part of CHVE to form a hazy, but stable blend which showed no tendency to separate into distinct layers after several weeks storage at room temperature. This mix is designated Composition N. Coating baths were prepared and coated on PEK to 1 g/m² weight using the lab coater, then photocured (in air) by exposure to 400 watts/in UV lamp power at 200 ft/min line speed in the RPC Lab Processor as described above. TESA 4970 acrylic test tape was affixed to the cured coatings and these laminates aged 20 hours at 70° C. before release (at 50 inch/min pull) was recorded. Our result are tabulated here:

| BATH | | RELEASE |
|---|---|---|
| 100/2 | F/Catl 2 | 40 g/in |
| 100/2 | M/Catl 2 | 380 |
| 100/2 | N/Catl 2 | 725 |
| 75/25/2 | F/M/Catl 2 | 30 |
| 75/25/2 | F/N/Catl 2 | 100 |
| 50/50/2 | F/M/Catl 2 | 30 |
| 50/50/2 | F/N/Catl 2 | 150 |
| 25/75/2 | F/M/Catl 2 | 60 |
| 25/75/2 | F/N/Catl 2 | 180 |

The superior controlled release performance obtained when composition N, 25% CHVE –75% polymer M, is substituted for polymer M alone, is remarkable and unexpected. Not only does the blend give release twice that of polymer M in this test, but all mixtures of polymer F with the CHVE-containing composition provide much larger release differentials than those observed when polymer M alone is used for controlled release. In fact, polymer M is completely ineffective for controlled release performance when present at less than 75% with polymer F (a low release epoxysilicone).

It has also been found that DDVE and CHMVE, vinyl ether monomers, when blended with the premium or low release epoxy silicone, polymer C, serve as an effective viscosity modifier and release modifier, respectively. The following coating baths were prepared and coated on PEK liner at 50 ft/min line speed using a Dixon 12 pilot coater equipped with a three roll offset gravure coating head and 2×300 watt/inch focused Fusion H ultraviolet lamps. 2 parts by weight of catalyst solution 2 were added to the coating baths per 100 parts by weight of the coating bath. All baths cured to smear and migration free coatings immediately upon exposure to the lamps; coat weights for the baths averaged 1.2 g/m². The coated PEK liner was laminated with solvent-borne Ashland 1085 acrylic pressure sensitive adhesive (PSA) with a paper label stock placed on the PSA layer. Two inch wide tapes of the laminates were cut, and the force required to remove the release liner from the PSA at a 400 inch per minute speed recorded at 3 days and 7 days after preparing the laminates. The results are tabulated as follows:

| Bath | Viscosity | 3 Day Release | 7 Day Release |
|---|---|---|---|
| Polymer C | 300 cstk | 26 g/2 in | 26 g/2 in |
| 9/1 C/DDVE | 180 cstk | 28 | 31 |
| 8/2 C/DDVE | 120 cstk | 32 | 32 |
| 19/1 C/CHMVE | 260 cstk | 38 | 41 |
| 9/1 C/CHMVE | 210 cstk | 60 | 65 |
| 4/1 C/CHMVE | 150 cstk | 106 | 79 |

The inclusion of up to about 20 weight percent DDVE produced no significant effect on release while reducing the viscosity of the coating bath by more than 50%, making DDVE a preferred reactive diluent for epoxy-silicone premium release applications. It was also observed that inclusion of only about 10 weight percent CHMVE in the polymer C bath more than doubled release of the cured coating compared to that of the control. Thus, at low concentrations, CHMVE is an effective controlled release additive by itself.

Having described the invention that which is claimed is:

1. An ultra-violet or electron beam curable silicone coating composition comprising:

(a) an epoxy functional silicone selected from the group consisting of $MD_xD^E_yQ_zT_uD^R_fD^A_kD^P_j(D'(CH(R)CH_2O)_m)_nD^B_pM$,
$M^ED_xD^E_yQ_zT_uD^R_fD^A_kD^P_j(D'(CH(R)CH_2O)_m)_nD^B_pM^E$,
$M^ED_xD^E_yQ_zT_uD^R_fD^A_kD^P_j(D'(CH(R)CH_2O)_m)_nD^B_pM$, and mixtures thereof;

where $M=(CH_3)_3SiO_{1/2}$,
$M^E=(C_6H_9O(CH_2)_2)(CH_3)_2SiO_{1/2}$,
$D=(CH_3)_2SiO_{2/2}$,
$D'=(CH_3)_3SiO_{2/2}$,
$D^E=(C_6H_9O(CH_2)_2)(CH_3)SiO_{2/2}$,
$D^R_f=(CF_3CH_2CH_2)(CH_3)SiO_{2/2}$,
$D^A=((HO)(C_2H_3)C_6H_9(CH_2)_2)(CH_3)SiO_{2/2}$,
$D^P=((HO)(C_6H_4)(CH_2)_3)(CH_3)SiO_{2/2}$,
$D^B=((C_6H_5COO)(HO)(C_6H_9)(CH_2)_2)(CH_3)SiO_{2/2}$,
$Q=SiO_{4/2}$,
$T=(CH_3)_3SiO_{3/2}$, where R is selected from the group consisting of hydrogen, methyl, and ethyl, and where j, k, l, m, n, p, x, y, z, and u are positive integers and k, l, n, p, and u may be zero and wherein said epoxy functional silicone has a viscosity ranging from about 100 to about 100, 000 centistokes at 25° C.;

(b) an unsaturated ether compound selected from the group consisting of:

$CH_2=CH-O-(CH_2)_{11}CH_3$,
$(CH_2=CH-O-CH_2)_2-(C_6H_{10})$
$CH_2=CH-O-(CH_2CH_2-O-)_3-CH=CH_2$,
$(CH_2=CHOCH_2)(HOCH_2)(C_6H_{10})$,
$CH_2(CH_2CO_2CH_2-C_6H_{10}-CH_2OCH=CH_2)_2$
$(CH_2=CHO(CH_2)_4O_2C)_2(C_6H_4)$, and mixtures thereof; and (c) an effective amount of a bis(dodecylphenyl) iodonium salt photocatalyst, said photocatalyst being selected from the salts of the group of acids consisting of hexafluoroantimonic acid, hexafluoroarsenic acid, hexafluorophosphoric acid, tetrafluoroboric acid, tetra (perfluorophenyl)boric acid and mixtures thereof.

2. The composition of claim 1 wherein component (b) ranges from about 1 to about 49 percent by weight of the composition comprising components (a), (b), and (c).

3. The composition of claim 1 wherein component (b) ranges from about 2 to about 25 percent by weight of the composition comprising components (a), (b), and (c).

4. The composition of claim 1 wherein component (b) ranges from about 5 to about 20 percent by weight of the composition comprising components (a), (b), and (c).

5. The composition of claim 1 wherein the epoxy-functional silicone is $MD_xD^E_yQ_zT_uD^{Rf}_jD^A_kD^P_l(D'(CH(R)CH_2O)_m)_nD^B_pM$.

6. The composition of claim 5 wherein component (b) ranges from about 1 to about 49 percent by weight of the composition comprising components (a), (b), and (c).

7. The composition of claim 5 wherein component (b) ranges from about 2 to about 25 percent by weight of the composition comprising components (a), (b), and (c).

8. The composition of claim 5 wherein component (b) ranges from about 5 to about 20 percent by weight of the composition comprising components (a), (b), and (c).

9. The composition of claim 1 wherein the epoxy-functional silicone is $M^ED_xD^E_yQ_zT_uD^{Rf}_jD^A_kD^P_l(D'(CH(R)CH_2O)_m)_nD^B_pM$.

10. The composition of claim 9 wherein component (b) ranges from about 1 to about 49 percent by weight of the composition comprising components (a), (b), and (c).

11. The composition of claim 9 wherein component (b) ranges from about 2 to about 25 percent by weight of the composition comprising components (a), (b), and (c).

12. The composition of claim 9 wherein component (b) ranges from about 5 to about 20 percent by weight of the composition comprising components (a), (b), and (c).

13. The composition of claim 1 wherein the epoxy-functional silicone is $M^ED_xD^E_yQ_zT_uD^{Rf}_jD^A_kD^P_l(D'(CH(R)CH_2O)_m)_nD^B_pM^E$.

14. The composition of claim 13 wherein component (b) ranges from about 1 to about 49 percent by weight of the composition comprising components (a), (b), and (c).

15. The composition of claim 13 wherein component (b) ranges from about 2 to about 25 percent by weight of the composition comprising components (a), (b), and (c).

16. The composition of claim 13 wherein component (b) ranges from about 5 to about 20 percent by weight of the composition comprising components (a), (b), and (c).

17. An ultra-violet or electron beam curable silicone coating composition consisting essentially of:

(a) an epoxy functional silicone selected from the group consisting of
$MD_xD^E_yQ_zT_uD^{Rf}_jD^A_kD^P_l(D'(CH(R)CH_2O)_m)_nD^B_pM$.
$M^ED_xD^E_yQ_zT_uD^{Rf}_jD^A_kD^P_l(D'(CH(R)CH_2O)_m)_nD^B_pM^E$.
$M^ED_xD^E_yQ_zT_uD^{Rf}_jD^A_kD^P_l(D'(CH(R)CH_2O)_m)_nD^B_pM$.
and mixtures thereof;
where
$M=(CH_3)_3SiO_{1/2}$.
$M^E=(C_6H_9O(CH_2)_2)(CH_3)_2SiO_{1/2}$.
$D=(CH_3)_2SiO_{2/2}$.
$D'=(CH_3)_3SiO_{2/2}$.
$D^E=(C_6H_9O(CH_2)_2)(CH_3)SiO_{2/2}$.
$D^R_f=(CF_3CH_2CH_2)(CH_3)SiO_{2/2}$.
$D^A=((HO)(C_2H_3)C_6H_9(CH_2)_2)(CH_3)SiO_{2/2}$.
$D^P=((HO)(C_6H_4)(CH_2)_3)(CH_3)SiO_{2/2}$.
$D^B=((C_6H_5COO)(HO)(C_6H_9)(CH_2)_2)(CH_3)SiO_{2/2}$.
$Q=SiO_{4/2}$.
$T=(CH_3)_3SiO_{3/2}$.

where R is selected from the group consisting of hydrogen, methyl, and ethyl, and where j, k, l, m, n, x, y, z, and u are positive integers and k, l, n, and u may be zero and wherein said epoxy functional silicone has a viscosity ranging from about 100 to about 100,000 centistokes at 25° C.;

(b) an unsaturated ether compound selected from the group consisting of:
$CH_2=CH-O-(CH_2)_{11}CH_3$.
$(CH_2=CH-O-CH_2)_2-(C_6H_{10})$
$CH_2=CH-O-(CH_2CH_2-O-)_3-CH=CH_2$.
$(CH_2=CHOCH_2)(HOCH_2)(C_6H_{10})$.
$CH_2(CH_2CO_2CH_2-C_6H_{10}-CH_2OCH=CH_2)_2$
$(CH_2=CHO(CH_2)_4O_2C)_2(C_6H_4)$,
and mixtures thereof; and (c) an effective amount of a bis(dodecylphenyl) iodonium salt photocatalyst, said photocatalyst being selected from the salts of the group of acids consisting of hexafluoroantimonic acid, hexafluoroarsenic acid, hexafluorophosphoric acid, tetrafluoroboric acid, tetra (perfluorophenyl)boric acid and mixtures thereof.

* * * * *